United States Patent [19]
Handly et al.

[11] Patent Number: 5,862,152
[45] Date of Patent: Jan. 19, 1999

[54] HIERARCHICALLY MANAGED BOUNDARY-SCAN TESTABLE MODULE AND METHOD

[75] Inventors: Paul Robert Handly, Gilbert, Ariz.;
Brian Lee Deitrich, Champaign, Ill.;
Robert Francis Yockey, Gilbert, Ariz.

[73] Assignee: Motorola, Inc., Schaumburg, Ill.

[21] Appl. No.: 558,122

[22] Filed: Nov. 13, 1995

[51] Int. Cl.$^6$ .................................................. G01R 31/28
[52] U.S. Cl. ..................................... 371/22.32; 371/22.31
[58] Field of Search ................................ 371/22.3, 25.1, 371/22.1, 22.6, 22.31, 22.32, 22.34, 22.5, 27.5; 324/158 R; 395/575, 183.06, 183.13, 183.2; 365/201; 364/488, 489

[56] References Cited

U.S. PATENT DOCUMENTS

| | | | |
|---|---|---|---|
| 4,947,395 | 8/1990 | Bullinger et al. | 371/22.3 |
| 5,029,166 | 7/1991 | Jarwala et al. | 371/22.1 |
| 5,054,024 | 10/1991 | Whetsel | 371/22.3 |
| 5,173,904 | 12/1992 | Daniels et al. | 371/22.3 |
| 5,281,864 | 1/1994 | Hahn et al. | 307/272.2 |
| 5,325,368 | 6/1994 | James et al. | 371/22.3 |
| 5,423,050 | 6/1995 | Taylor et al. | 395/575 |
| 5,448,576 | 9/1995 | Russell | 371/22.3 |

*Primary Examiner*—Robert W. Beausoliel, Jr.
*Assistant Examiner*—Nadeem Iqbal
*Attorney, Agent, or Firm*—Frank J. Bogacz

[57] ABSTRACT

A JTAG module (12) includes a master component (20) and any number of slave components (22). The master component (20) includes a TAP controller (24) and related control circuits. Through a control bus (35), the TAP controller (24) on the master component (20) controls boundary-scan registers (18) on the slave components (22). The boundary-scan registers (18) in the slave components (22) form a boundary-scan chain that originates and terminates at the master component (20). TAP controller circuitry may be omitted from the slave components (22). The boundary-scan registers (18) on the master and slave components (20, 22) are partitioned into external sections (26, 34) and internal sections (28, 36). The external sections couple to conductive traces (46) which are accessible from outside the module (12). The internal sections couple to conductive traces (48) which are substantially inaccessible from outside the module (12).

20 Claims, 3 Drawing Sheets

HIERARCHICALLY MANAGED BOUNDARY-SCAN TESTABLE MODULE AND METHOD

LICENSE RIGHTS

The U.S. Government has a paid-up license in this invention and the right in limited circumstances to require the patent owner to license others on reasonable terms as provided for by the terms of Contract No. MDA904-94-C-B023.

FIELD OF THE INVENTION

The present invention relates to the Joint Test Action Group (JTAG) or the boundary-scan testing of electronic circuits substantially in accordance with IEEE 1149.1-1990: IEEE Standard Test Access Port and Boundary-Scan Architecture and similar testing architectures and techniques.

BACKGROUND OF THE INVENTION

JTAG testing, also known as boundary-scan testing, refers to the testing of integrated circuit components and their interconnections through the use of a standardized serial test bus. In accordance with conventional JTAG architectures, JTAG components include internal circuitry dedicated to the JTAG function and four or five pins through which JTAG testers communicate with the components' JTAG circuitry. This internal circuitry includes a boundary-scan register and a test access port (TAP) controller. The boundary-scan register resides between the JTAG component's I/O pins and core logic circuits. Under the control of the TAP controller, the boundary-scan register may be substantially transparent to the normal operation of the JTAG component, may impress test vectors in lieu of logic states at the I/O pins and may sample logic states at the I/O pins. The boundary-scan registers of the various JTAG components within an electronic system are coupled together in series to make one long boundary-scan chain. A tester shifts out instructions and test vectors and shifts in control register contents and sampled test data through this boundary-scan chain.

Conventional JTAG test architectures fail to adequately manage and organize testing in many electronic systems and particularly in systems in which electronic components are arranged hierarchically. In hierarchically arranged systems, components are not independently or randomly interconnected. Rather, components are grouped together into modules, including hybrids, mother boards, daughter boards, other circuit boards, single in-line memory modules (SIMMs), multichip modules (MCMs) etc. Electronic systems are often constructed from an assortment of such modules.

The many benefits of modular construction include treating a single module as a unit rather than as a collection of individual components. Design, manufacturing and testing activities are all performed more quickly, more reliably and less expensively when a system is treated as a collection of a few modules rather than a collection of many components. However, conventional JTAG testing architectures fail to adequately support modular testing. In modular testing, testing is performed to a module level rather than to a component level. If a failure is detected in a module, then the entire module fails without regard to which components or interconnections within the module may be the cause of the module failure. Module-level testing is typically greatly simplified and much quicker than component-level testing for a given system. Simplification is highly desirable because it leads to quicker test design and debug along with more reliable test use.

Conventionally, JTAG components on modules are treated individually for testing purposes. Consequently, test vectors and circuitry descriptions become complex when the many individual JTAG components in a system are strung together. In addition, boundary-scan chains often become so long that serial data communication through the boundary-scan chains leads to slow test procedures. Increased reliability occurs because the signals internal to the module do not need to be accessed during testing in the higher-level assemblies. This is especially important when tri-state buffers share a common internal bus on the module. In this case, JTAG testing must ensure that multiple tri-state buffers with differing logic levels are not turned on simultaneously. By separating the internal and external boundary-scan paths, higher-level assemblies would not be manipulating the internal scan path, and would not be concerned with any potential damage to the module.

Furthermore, the requirement of including JTAG circuitry on many components of a module places an unnecessary burden on power consumption and the design task. If, for example, JTAG circuitry imposes an average 2000 gate burden on a JTAG component, then a component which cannot afford the 2000 gate burden due to a gate-limited design may be required to omit JTAG circuitry altogether. Moreover, if components are implemented using high power technologies, such as ECL, then the JTAG circuitry burden may cause power consumption to exceed acceptable levels.

BRIEF DESCRIPTION OF THE DRAWINGS

A more complete understanding of the present invention may be derived by referring to the detailed description and claims when considered in connection with the Figures, wherein like reference characters refer to similar items throughout the Figures, and:

DETAILED DESCRIPTION OF THE DRAWINGS

Figure 1:
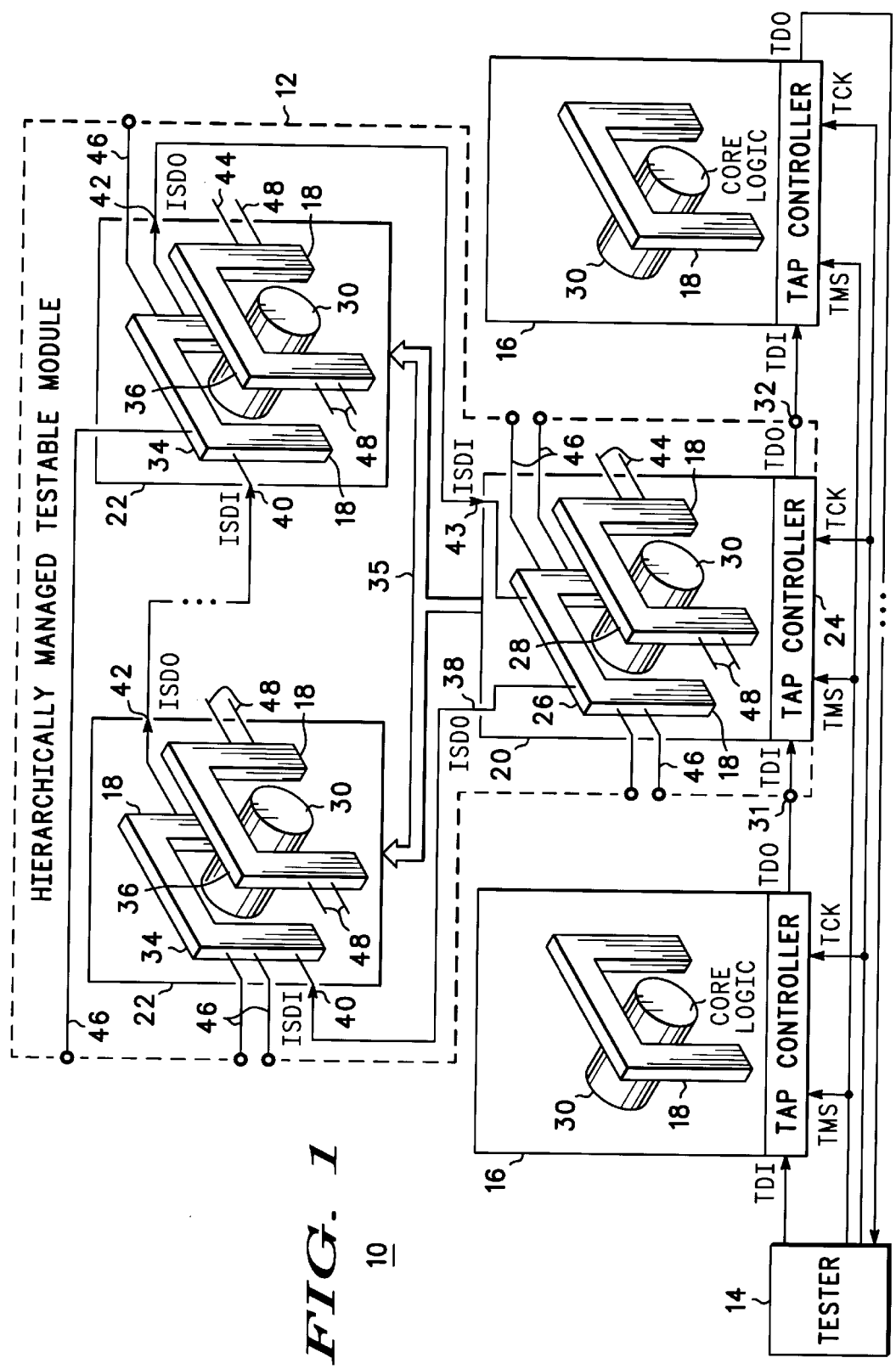
FIG. 1 is a block diagram of an electronic system which accommodates JTAG testing through the use of a hierarchically managed testable module.

FIG. 1 is a block diagram of electronic system 10 that accommodates JTAG testing through the use of a hierarchically managed testable module 12. System 10 includes tester 14 and any number of JTAG components 16 and modules 12.

Tester 14 is a conventional JTAG tester and JTAG components 16 are conventional JTAG components. Tester 14 drives a conventional JTAG bus, which includes test data in (TDI), test data out (TDO), test mode select (TMS) and test clock (TCK) signals. Although not shown, a test reset (TRST) signal may be included as well. Components 16 couple to the JTAG bus in a conventional manner. In particular, boundary-scan registers 18 of components 16 are coupled in series using TDI inputs and TDO outputs to form a boundary-scan chain driven by and terminated at tester 14.

Module 12 includes at least one master JTAG component 20 and any number of slave JTAG components 22. Master component 20 and each slave component 22 are physically separated semiconductor die or chips which are electrically interconnected together. Master component 20 and slave components 22 may be physically mounted together on a common substrate or circuit board or otherwise encapsulated or mounted together.

Master component 20 includes test access port (TAP) controller 24 and related control circuits (not shown), core logic section 30 and boundary-scan register 18 partitioned into an external register 26 and internal register 28. Master component 20 has TDI input 31 and TDO output 32 accessible from outside module 12. TMS and TCK inputs to master component 20 are accessible from outside module 12.

Slave components 22 each include a boundary-scan register 18 partitioned into external register 34 and internal register 36. Control bus 35 is driven by TAP controller 24 of master component 20. Bus 35 couples to slave components 22 so that boundary-scan registers 18 of slave components 22 are controlled by TAP controller 24 of master component 20. In particular, boundary-scan registers 18 of slave components 22 are controlled in response to the various JTAG states and JTAG instructions detected and decoded at master component 20.

An inter-module boundary-scan chain is formed by serially coupling boundary-scan registers 18 of slave components 22 together. An input and an output of this inter-module boundary-scan chain couples to master component 20. In particular, master component 20 has an internal serial data output (ISDO) 38 that couples to an internal serial data input (ISDI) 40 of a slave component 22. Slave components 22 are connected in series with ISDO 42 of one slave component 22 coupled to ISDI 40 of another slave component 22. As indicated by ellipsis in FIG. 1, any number of slave components 22 may be included in the inter-module boundary-scan chain. At the end of the inter-module boundary-scan chain, ISDO 40 of terminal slave component 22 couples to ISDI 43 of master component 20.

Boundary-scan registers 18 of components 20 and 22 couple to various conductive traces 44. Some of traces 44 interconnect components 20 and 22 together (not shown) and some of traces 44 connect components 20 and 22 to other components (not shown) of module 12 which are not JTAG components. Still other traces 44 connect components 20 and 22 to test points, connector pins or other ports which are accessible from outside module 12. External conductive traces 46 connect to external registers 26 and 34 and are accessible from outside module 12. Internal conductive traces 48 couple to internal registers 28 and 36 and are substantially inaccessible from outside module 12. Internal conductive traces 48 may, for example, interconnect components 20 and 22 or connect components 20 and 22 to non-JTAG components within module 12.

The partitioning of boundary-scan registers 18 into internal registers 28 and 36 and external registers 26 and 34 supports the hierarchical management of testing. As is discussed in more detail below, internal registers 28 and 36 couple to external registers 26 and 34 to permit test vector data and test sample data to be scanned through external registers 26 and 34 without requiring such data to be scanned through internal registers 28 and 36. Consequently, module-level testing need only concern itself with external registers 26. Component definitions are simpler and test vectors are simpler than if both internal and external registers were considered in the module-level testing. In addition, the length of the scan chain driven by tester 14 is reduced because module-level testing need not scan test vectors and test samples through internal registers 28 and 36. Test procedures may be conducted more quickly as a result. From the point-of-view of tester 14, hierarchical module 12 looks like a fully-compliant boundary-scan part. It does not treat module 12 any different than any of the other boundary-scan components 16.

However, component-level testing is not precluded. Component-level testing may be performed by a manufacturer to verify module operation before shipment to a customer. In this case, master component 20 and slave components 22 are non-boundary-scan compliant. The non-compliance comes from split internal registers 28 and 36 and external registers 26 and 34. This is not a problem when the parts are tested at the component-level. When a module is repairable, component-level testing may be performed to isolate a failure that has been detected through module-level testing. Internal registers 28 and 36 may be used to perform such component-level testing.

Increased reliability results when internal buses are present in the signals interconnecting master component 20 and slave components 22. With the separation of internal registers 28 and 36 from external registers 26 and 34, tri-statable buses do not need to be of a concern to higher-level assembly 10. Normally, JTAG tester 14 must ensure that tri-statable buffers with differing logic levels are not active simultaneously. Since higher-level assembly 10 does not control internal registers 28 and 36 during testing, the problem is not present.

In addition, the sharing of TAP controller 24 between master component 20 and slave components 22 enhances the scope of JTAG testing within module 12. Slave components 22 which have gate-limited designs or power consumption concerns need only implement a portion of JTAG circuitry. Those skilled in the art will appreciate that a significant portion of JTAG circuitry resides in the TAP controller and related control circuits. Thus, significant savings in gate count and power consumption may be achieved by omitting the TAP controller from slave components 22. JTAG testing may be extended to components which might have otherwise omitted JTAG testing due to a gate-limited design or power consumption concerns.

TAP Controller 24 does not need to be shared between master component 20 and slave components 22. Slave components 22 may have their own TAP Controllers 24 and instruction registers, as long as higher-level assembly 10 treats the concatenation of the instruction registers of master component 20 and slave components 22 as one when using JTAG tester 14. This accomplishes the same benefits as the scheme presented, without gate count or power consumption savings.

Figure 2:
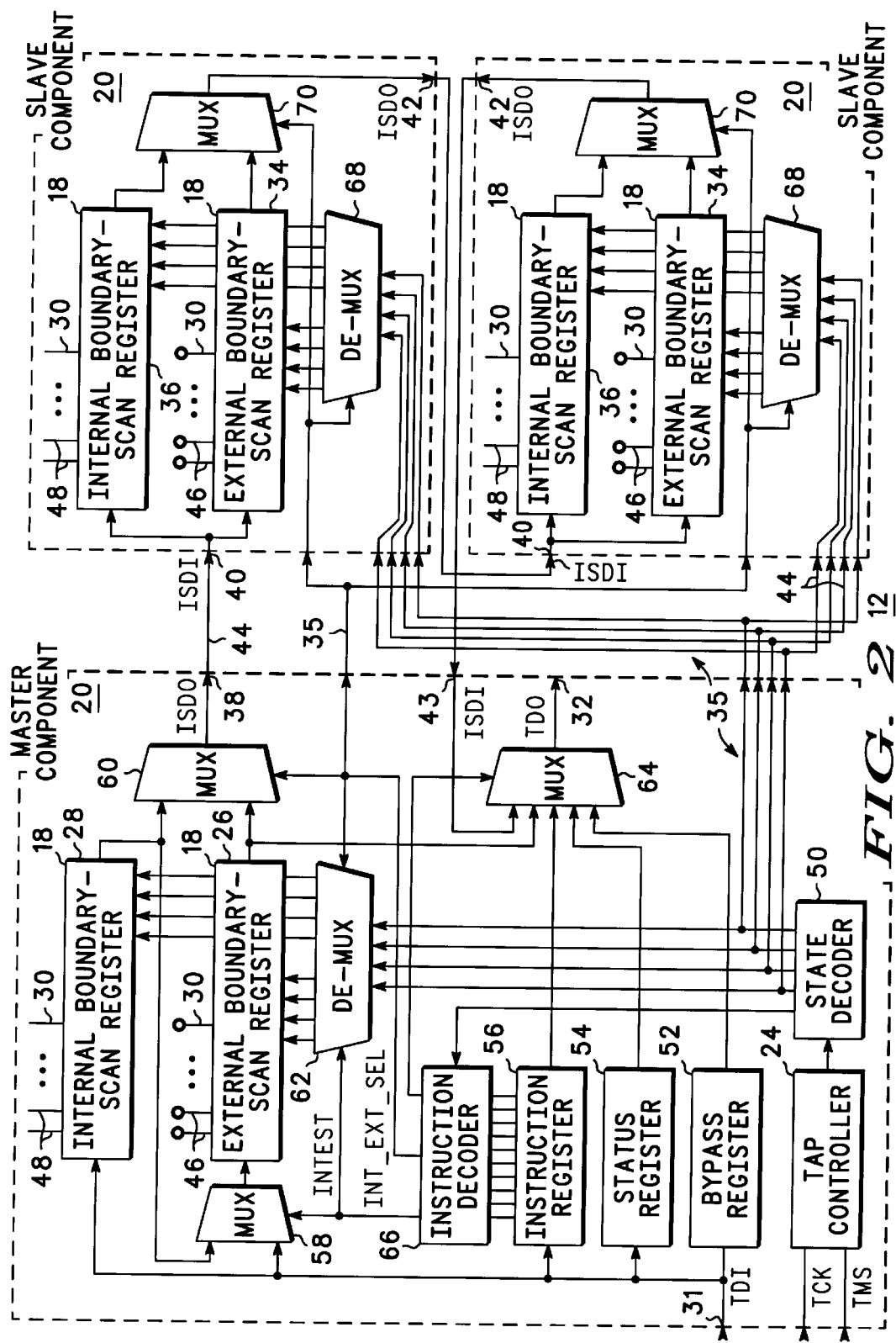
FIG. 2 is a block diagram of the hierarchically managed testable module.

FIG. 2 is a block diagram of hierarchically managed testable module 12. FIG. 2 depicts module 12 as having a single master component 20 and two slave components 22. However, any number of slave components 22 may be associated with each master component 20. TAP controller 24 of master component 20 receives the well-known TCK and TMS JTAG signals from outside module 12. TAP controller 24 cycles through various JTAG states in response to TCK and TMS signals in a conventional manner. An output of TAP controller 24 couples to a state decoder 50. State decoder 50 decodes the current state experienced by TAP controller 24 and outputs various control signals in response to the current state. Well known CLOCK-DR, UPDATE-DR, SHIFT-DR and BS-MODE signals are included in these control signals. The CLOCK-DR, UPDATE-DR, SHIFT-DR and BS-MODE signals along with an internal/external selection signal (INT_EXT_SEL) 35' form control bus 35, which exits master component 20 and couples to slave components 22. Bus 35 controls the operation of boundary-scan registers 18, whether internal registers 28 and 36, external registers 26 and 34 or whether on master component 20 or slave components 22. CLOCK-DR, UPDATE-DR, SHIFT-DR and BS-MODE signals are discussed in more detail below in connection with FIG. 3.

When slave components 22 contain their own TAP Controllers and instruction registers, control bus 35 and internal/external selection signal (INT_EXT_SEL) 35' are not needed. They are generated by each of slave components 22 individually. For this to work, JTAG signals TCK and TMS must be routed to slave components 22 so they can generate the equivalent signals that were included in control bus 35 and INT_EXT_SEL signal 35'.

TDI input 31 for module 12 and master component 20 couples to serial inputs of bypass register 52, status register 54, instruction register 56, internal boundary-scan register 28 and to a data input of multiplexer (MUX) 58, all located on master component 20. A serial output of internal register 28 couples to data inputs of multiplexer 58 and multiplexer 60. Control inputs of internal register 28 couple to outputs of demultiplexer 62 (DE-MUX). Various system inputs and outputs of internal register 28 couple to internal conductive traces 48 and to core logic 30 (FIG. 1) of master component 20. An output of multiplexer 58 couples to a serial input of external boundary-scan register 26 and a serial output of external register 26 couples to a data input of multiplexer 60. An output of multiplexer 60 couples to internal serial data output (ISDO) 38 of master component 20. Control inputs of external register 26 couple to outputs of demultiplexer 62. Various system inputs and outputs of external register 26 couple to external conductive traces 46 and to core logic 30 of master component 20.

An output of external register 26 additionally couples to an input of multiplexer 64, as do serial outputs of bypass register 52, status register 54 and instruction register 56. Another input of multiplexer 64 couples to internal serial data input (ISDI) 43 of master component 20. An output of multiplexer 64 couples to TDO output 32 of master component 20 and module 12. Inputs of an instruction decoder 66 couple to parallel outputs of instruction register 56 and to a control output of state decoder 50. An output of instruction decoder 66 that activates during an INTEST instruction couples to a select input of multiplexer 58 and an enable input of demultiplexer 62. An output 35' of instruction decoder 66 provides the above-discussed INT_EXT_SEL signal and couples to selection inputs of demultiplexer 62 and multiplexer 60 and forms a portion of control bus 35. Additional outputs from instruction decoder 66 couple to selection inputs of multiplexer 64 to control the selection of data sources made at multiplexer 64. Those skilled in the art will appreciate that additional JTAG-compatible components and interconnections may be included within master component 20 For example, an ID register (not shown) may be included.

TAP controller 24, state decoder 50, instruction register 56, status register 54 and bypass register 52 all operate in a conventional manner. Conventional JTAG instructions, such as EXTEST, INTEST, PRELOAD/SAMPLE, etc. are loaded into instruction register 56 through the operation of TDI, TCK and TMS signals.

However, when an INTEST instruction is detected, multiplexer 58 is controlled to route the output of internal register 28 to the input of external register 26 and demultiplexer 62 is controlled to route control bus 35 signals to both internal and external registers 28 and 26. Likewise, during an INTEST instruction, instruction decoder 66 causes multiplexer 64 to route the serial boundary-scan output from external register 26 to TDO output 32. Accordingly, during an INTEST instruction, test vectors and test samples are routed through both internal and external registers 28 and 26 and provided as the boundary-scan output at TDO output 32. In the preferred embodiment, an INTEST instruction does not encompass slave components 22 for convenience of implementation. However, INTEST could be implemented on slave components 22 with the routing of INTEST signals between master component 20 and slave components 22 and the inclusion of additional gating on slave components 22.

Conventional EXTEST and PRELOAD/SAMPLE instructions become module-level instructions for module 12. When an EXTEST or PRELOAD/SAMPLE instruction is detected, the INT_EXT_SEL signal is controlled to select external register 26. In particular, multiplexer 58 is controlled to route TDI data directly to external register 26 without first being passed through internal register 28. Multiplexer 60 is controlled to route the output from external register 26 to ISDO 38 and demultiplexer 62 is controlled to route control bus 35 only to external register 26. At the same time, multiplexer 64 is controlled to route data from ISDI 43 to TDO output 32. Accordingly, during an EXTEST or PRELOAD/SAMPLE instruction, test vectors and test samples are routed only through external register 26 and out from master component 20 at ISDO 38 while data appearing at ISDI 32 are routed out of master component 20 at TDO output 32.

An EXTEST_INTERNAL instruction and a PRELOAD/SAMPLE_INTERNAL instruction are component-level instructions for the components within module 12. Such instructions may be performed by a manufacturer or submodule repair facility only. These "internal" instructions operate like the above-discussed EXTEST and PRELOAD/SAMPLE instructions, except that the INT_EXT_SEL signal selects internal register 28 rather than external register 26. Test vectors and test samples are routed only through internal register 28 and out from master component 20 at ISDO 38 while data appearing at ISDI 43 are routed out of master component 20 at TDO output 32.

Other than as described above, master component 20 may operate in a conventional manner. For example, control register outputs from bypass register 52, status register 54 or instruction register 56 may be selected at multiplexer 64 as a source for data to supply to TDO output 32.

Master component 20 couples to slave components 22 through conductive traces 44. Control bus 35, including INT_EXT_SEL signal 35', couples to each slave component 22 and serves as an input thereto. ISDO 38 of master component 20 couples to ISDI 40 of a first slave component 22, ISDO 42 of the first slave component 22 couples back to ISDI 43 of master component 20 through 0–N additional slave components 22, where N is an integer number. In the example of FIG. 2, ISDO 42 of the first slave component couples to ISDI 40 of a second slave component 22. ISDO 42 of the second slave component 22 couples to ISDI 43 of master component 20. Accordingly, slave components 22 form a boundary-scan chain that originates and terminates at master component 20.

Each slave component 22 has structure similar to the structure of other slave components. Control bus 35 couples to demultiplexer 68. First control outputs of demultiplexer 68 couple to control inputs of external boundary-scan register 34 and second control outputs of demultiplexer 68 couple to control inputs of internal boundary-scan register 36. ISDI 40 couples to serial inputs of external and internal registers 34 and 36. Serial outputs of external and internal registers 34 and 36 couple to data inputs of multiplexer 70. Various system inputs and outputs of internal register 36 couple to internal conductive traces 48 and to core logic 30 (FIG. 1) of slave component 22. Various system inputs and outputs of external register 34 couple to external traces 46 and to core logic 30. INT_EXT_SEL signal 35' couples to a selection input of multiplexer 70. An output of multiplexer 70 couples to ISDO 42.

During an EXTEST or PRELOAD/SAMPLE instruction, test vectors and test samples are routed from ISDI 40, through external register 34 and multiplexer 70, to ISDO 42. During an EXTEST_INTERNAL or PRELOAD/SAMPLE_INTERNAL instruction, test vectors and test samples are routed from ISDI 40, through internal register 36 and multiplexer 70, to ISDO 42.

Figure 3:
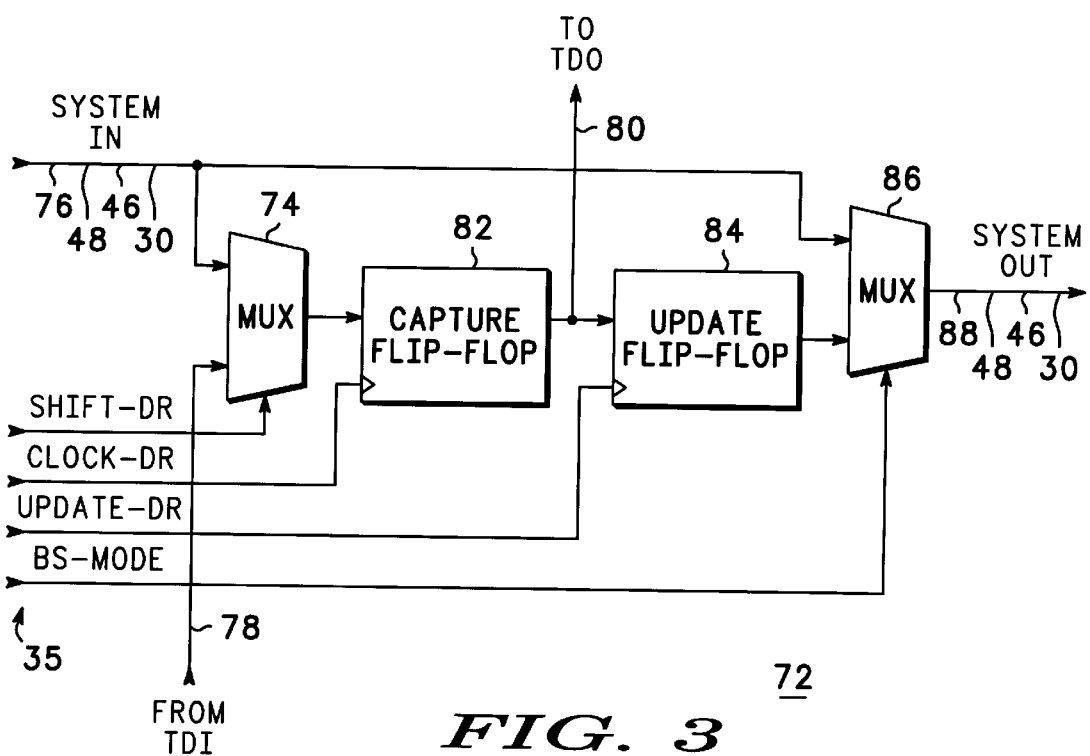
FIG. 3 is a block diagram of a single boundary-scan register cell.

FIG. 3 is a block diagram of a single boundary-scan register cell 72. Boundary-scan registers 18, whether external, internal, master or slave, are composed of any number of cells 72. Cell 72 includes multiplexer 74 which has a first data input coupled to system input 76. System input 76 is supplied by either an external or internal conductive trace 46 or 48 if cell 72 resides at an input to component 20 or 22 or to core logic 30 if cell 72 resides at an output from component 20 or 22. A second data input of multiplexer 74 couples to serial data input 78. Serial data input 78 is driven by serial data output 80 from a previous stage (not shown) in boundary-scan register 18 or by a serial data input to component 20 or 22. A select input of multiplexer 74 is driven by the SHIFT-DR signal from control bus 35. An output from multiplexer 74 couples to a data input of capture flip-flop 82. A clock input of capture flip-flop 82 is driven by the CLOCK-DR signal from control bus 35. An output from capture flip-flop 82 couples to serial data output 80 of cell 72 and to a data input of update flip-flop 84. Data output 80 drives serial data input 78 of a subsequent stage in boundary-scan register 18 (not shown) or a serial data output of component 20 or 22.

A clock input of update flip-flop 84 is driven by the UPDATE-DR signal from control bus 35. An output from update flip-flop 84 couples to a first data input of multiplexer 86. A second data input of multiplexer 86 couples to system input 76. A select input of multiplexer 86 couples to the BS-MODE signal of control bus 35 and an output of multiplexer 86 couples to system output 88. System output 88 is supplied by either an external or internal conductive trace 46 or 48 if cell 72 resides at an output of component 20 or 22 or to core logic 30 if cell 72 resides at an input to the component 20 or 22.

In accordance with conventional JTAG control signal operation, SHIFT-DR causes either a system logic state or the logic state of a previous boundary-scan cell 72 to be applied to the data input of capture flip-flop 82. CLOCK-DR clocks capture flip-flop 82 during an appropriate state of TAP controller 24 (FIG. 2) to either sample system data or to capture test data. UPDATE-DR clocks update flip-flop 82 during an appropriate state of TAP controller 24 to transfer data from capture flip-flop 82. BS-MODE causes the cell output to reflect either the system input or the test vector currently present in update flip-flop 84.

In summary, the present invention provides an improved hierarchically managed testable module. A boundary-scan register is partitioned into external and internal sections. The external sections are used for module-level testing to simplify module descriptions and test vectors and to shorten test vectors so that test procedures may be performed quickly. A TAP controller and related control circuitry of a master component control boundary-scan registers in slave components which omit the TAP controller and control circuitry. The slave components benefit from a reduced gate count and lessened power consumption compared with a full JTAG implementation.

The present invention has been described above with reference to preferred embodiments. However, those skilled in the art will recognize that changes and modifications may be made in these preferred embodiments without departing from the scope of the present invention. For example, those skilled in the art will appreciate that the various names used for conventional JTAG signals and states may vary throughout the industry, but that the functioning and nature of such signals may nevertheless be equivalent from application to application. Moreover, those skilled in the art will appreciate that additional JTAG functions, such as reset, may be implemented even though such functions are not described herein. These and other changes and modifications which are obvious to those skilled in the art are intended to be included within the scope of the present invention.

What is claimed is:

1. A module, said module being a hierarchically managed testable module, for use in connection with boundary-scan testing, said module comprising:

a master component having a test-access-port (TAP) controller and having a master component boundary-scan register coupled to and controlled by said TAP controller;

a slave component having a slave component boundary-scan register coupled to and controlled by said TAP controller of said master component;

said slave component is one of a plurality of slave components each having a boundary-scan register coupled to and controlled by said TAP controller of said master component and;

each said slave component boundary-scan register of said plurality of slave components is serially coupled together into a boundary-scan chain having an input coupled to said master component and an output coupled to said master component.

2. A module as claimed in claim 1 wherein said master and slave components are physically separated semiconductor die electrically interconnected by conductive traces.

3. A module as claimed in claim 1 wherein:

said master component additionally has a TDI input (test -data-in input) and a TDO output (test-data-out output), said TDI input being coupled to said master component boundary-scan register and said TDI input and TDO output being accessible from outside said module;

said master component additionally has a master component internal serial data output coupled to said master component boundary-scan register and has a master component internal serial data input coupled to said TDO output;

said slave component has an internal serial data input coupled to said master component internal serial data output and to said slave component boundary-scan register; and said slave component additionally has an internal serial data output coupled to said slave component boundary-scan register and to said master component internal serial data input.

4. A module as claimed in claim 1 wherein:

said slave component has a slave component internal serial data output coupled to said slave component boundary-scan register;

said master component has a master component internal serial data input coupled to said slave component internal serial data output and has a test-data-out (TDO) output and a plurality of control registers each of which have control register outputs; and said master component additionally has selecting means, having inputs coupled to said master component internal serial data input and to said control register outputs and having an output coupled to said TDO output, for selecting a source for data to supply at said TDO output.

5. A module as claimed in claim 4 wherein said master component additionally has an instruction decoder coupled to said selecting means, said instruction decoder being configured to supply data from said master component internal serial data input at said TDO output during an EXTEST instruction.

6. A module as claimed in claim 1 wherein:
said master component boundary-scan register has a master component external register and a master component internal register;
said slave component boundary-scan register has a slave component external register and a slave component internal register; and
said master component external register, said master component internal register, said slave component external register and said slave component internal register are interconnected to permit data to be scanned through said master component external register and each said slave component external register without requiring data to be scanned through said master component internal register and each said slave component internal register.

7. A module as claimed in claim 6 additionally comprising:
external conductive traces coupled to one or more of said master component external register and said slave component external register, said external conductive traces being accessible from outside said module; and
internal conductive traces coupled to one or more of said master component internal register and said slave component internal register, said internal conductive traces being substantially inaccessible from outside said module.

8. A module as claimed in claim 6 additionally comprising:
an instruction decoder within said master component, said instruction decoder being coupled to said TAP controller and configured to generate an internal/external selection signal;
first selecting means, coupled to said master component internal register and said master component external register for selecting between said master component internal register and said master component external register in response to said internal/external selection signal; and
second selecting means, coupled to said slave component internal register and said slave component external register, for selecting between said slave component internal register and said slave component external register in response to said internal/external selection signal.

9. A module as claimed in claim 1 wherein:
said master component TAP controller includes a state decoder configured to generate CLOCK-DR, UPDATE-DR, SHIFT-DR and BS-MODE signals; and
said module additionally comprises means for coupling said CLOCK-DR, UPDATE-DR, SHIFT-DR and BS-MODE signals from said master component to said boundary-scan register of said slave component.

10. A module, said module being a hierarchically managed testable module, for use in connection with boundary-scan testing, said module comprising:
a test-access-port (TAP) controller;
an external boundary-scan register coupled to said TAP controller; and
a plurality of internal boundary-scan registers, each of said plurality including an internal boundary-scan register coupled to said TAP controller and to said external boundary-scan register to permit data to be scanned through said external boundary-scan register without requiring data to be scanned through said internal boundary-scan register;
said internal boundary-scan register and said external boundary-scan register each have master portions and slave portions;
said master portions of said internal boundary-scan register and said external boundary-scan register and said TAP controller reside on a master component; and
said slave portions of said internal boundary-scan register and said external boundary-scan register reside on a slave component, said master and slave components being physically separated semiconductor die electrically interconnected by conductive traces.

11. A module as claimed in claim 10 additionally comprising:
external conductive traces coupled to said external boundary-scan register, said external conductive traces being accessible from outside said module; and
internal conductive traces coupled to said internal boundary-scan register, said internal conductive traces being substantially inaccessible from outside said module.

12. A module as claimed in claim 10 additionally comprising:
an instruction decoder coupled to said TAP controller and configured to generate an internal/external selection signal; and
selecting means, coupled to said internal boundary-scan register and said external boundary-scan register for selecting between said internal boundary-scan register and said external boundary-scan register in response to said internal/external selection signal.

13. A module as claimed in claim 10 wherein:
said TAP controller includes a state decoder configured to generate CLOCK-DR, UPDATE-DR, SHIFT-DR and BS-MODE signals; and
said module additionally comprises means for coupling said CLOCK-DR, UPDATE-DR, SHIFT-DR and BS-MODE signals from said master component to said slave component.

14. A method of performing hierarchically managed boundary-scan testing on an electronic module comprising steps of:
detecting boundary-scan states at a master component;
decoding boundary-scan instructions at said master component;
providing a master boundary-scan register at said master component;
providing a plurality of slave boundary-scan registers, each of said plurality including a slave boundary-scan register at a corresponding slave component; and
controlling said master and slave boundary-scan registers in response to states and instructions detected and decoded, respectively, at said matter component;

partitioning said master boundary-scan register into a master external register and a master internal register;

partitioning said slave boundary-scan register into a slave external register and a slave internal register; and controlling said master external register, said master internal register, said slave external register and said slave internal register to permit data to be scanned through said master external register and said slave external register without requiring said data to be scanned through said master internal register or said slave internal register.

15. A method as claimed in claim 14 additionally comprising a step of coupling said master boundary-scan register to said slave boundary-scan register so that said master and slave boundary-scan registers form a boundary-scan chain having a test-data-in (TDI) input located on said master component and a test-data-out (TDO) output located on said master component.

16. A method as claimed in claim 14 additionally comprising steps of:

routing external conductive traces to one or more of said master external register and said slave external register, said external conductive traces being accessible from outside said electronic module; and routing internal conductive traces to one or more of said master internal register and said slave internal register, said internal conductive traces being substantially inaccessible from outside said electronic module.

17. A method as claimed in claim 14 wherein:

said detecting step comprises the step of generating CLOCK-DR, UPDATE-DR, SHIFT-DR and BS-MODE signals; and said method additionally comprises the step of routing said CLOCK-DR, UPDATE-DR, SHIFT-DR and BS-MODE signals from said master component to said slave boundary-scan register.

18. In a system comprising a plurality of boundary scan modules, a method for reducing power consumption and chip area associated with boundary scan testing, said method comprising steps of:

providing a master component having a test-access-port (TAP) controller and having a master component boundary-scan register coupled to and controlled by said TAP controller;

providing a plurality of slave components, each of said plurality including a slave component having a slave component boundary-scan register coupled to and controlled by said TAP controller of said master component, wherein said master and slave components are physically separated semiconductor die electrically interconnected by conductive traces;

providing a master component includes a step of providing a master component additionally having a TDI input (test-data-in input) and a TDO output (test-data-out output), said TDI input being coupled to said master component boundary-scan register and said TDI input and TDO output being accessible from outside said module, and wherein said master component additionally has a master component internal serial data output coupled to said master component boundary-scan register and has a master component internal serial data input coupled to said TDO output; and providing a slave component includes a step of providing a slave component having an internal serial data input coupled to said master component internal serial data output and to said slave component boundary-scan register and wherein said slave component additionally has an internal serial data output coupled to said slave component boundary-scan register and to said master component internal serial data input.

19. A method as claimed in claim 18 wherein said step of:

providing a slave component includes a step of providing a slave component having a slave component internal serial data output coupled to said slave component boundary-scan register;

providing a master component includes a step of providing a master component additionally having a master component internal serial data input coupled to said slave component internal serial data output and has a test-data-out (TDO) output and a plurality of control registers each of which have control register outputs and wherein said master component additionally has selecting means, having inputs coupled to said master component internal serial data input and to said control register outputs and having an output coupled to said TDO output, for selecting a source for data to supply at said TDO output.

20. A module as claimed in claim 1 wherein said TAP controller of said master component is a sole source of TAP controller signals for said slave component boundary-scan register.

* * * * *